(12) United States Patent
Albsmeier et al.

(10) Patent No.: US 8,994,375 B2
(45) Date of Patent: Mar. 31, 2015

(54) LOCAL COIL SYSTEM

(75) Inventors: Andre Albsmeier, München (DE); Jan Bollenbeck, Eggolsheim (DE); Florian Poprawa, München (DE); Stefan Schwarzer, Taufkirchen (DE); Markus Vester, Nürnberg (DE)

(73) Assignee: Siemens Aktiengesellschaft, München (DE)

( * ) Notice: Subject to any disclaimer, the term of this patent is extended or adjusted under 35 U.S.C. 154(b) by 403 days.

(21) Appl. No.: 13/436,588

(22) Filed: Mar. 30, 2012

(65) Prior Publication Data
US 2012/0249135 A1   Oct. 4, 2012

(30) Foreign Application Priority Data
Mar. 31, 2011   (DE) .................. 10 2011 006 497

(51) Int. Cl.
*G01V 3/00* (2006.01)
*G01R 33/36* (2006.01)
*G01R 33/3415* (2006.01)

(52) U.S. Cl.
CPC ........ *G01R 33/3692* (2013.01); *G01R 33/3415* (2013.01); *G01R 33/3621* (2013.01)
USPC .......................................... 324/322; 324/318

(58) Field of Classification Search
CPC .................................................. G01R 33/3692
USPC .................... 324/322, 318, 314, 312
See application file for complete search history.

(56) References Cited

U.S. PATENT DOCUMENTS

| 5,245,288 | A | 9/1993 | Leussler |
| 5,384,536 | A | 1/1995 | Murakami et al. |
| 5,905,473 | A | 5/1999 | Taenzer |
| 6,791,322 | B2 * | 9/2004 | Vester .......................... 324/309 |
| 7,089,014 | B2 * | 8/2006 | Brown et al. ................. 455/450 |
| 7,280,810 | B2 * | 10/2007 | Feher ........................... 455/137 |
| 2002/0118727 | A1 | 8/2002 | Kim et al. |
| 2003/0078004 | A1 | 4/2003 | Vester |
| 2003/0122546 | A1 | 7/2003 | Leussler |
| 2007/0182409 | A1 | 8/2007 | Varjo |
| 2007/0189409 | A1 | 8/2007 | Hottinen |
| 2008/0265889 | A1 | 10/2008 | Zhai et al. |

(Continued)

FOREIGN PATENT DOCUMENTS

| CN | 1420363 A | 5/2003 |
| CN | 1430067 A | 7/2003 |

(Continued)

OTHER PUBLICATIONS

A. Oppelt, "Magnetic resonance imaging," Imaging Systems for Medical Diagnostics, pp. 540-599, 2005.

(Continued)

*Primary Examiner* — Louis Arana
(74) *Attorney, Agent, or Firm* — Lempia Summerfield Katz LLC

(57) ABSTRACT

The present embodiments relate to a local coil system for a magnetic resonance system. The local coil system includes at least one local coil for detecting MR response signals and at least one transmitting device for the wireless transmission of signals to a receiver of the magnetic resonance system. The local coil system is embodied with a transmitter-side diversity. A receiver-side diversity may exist in the magnetic resonance system.

15 Claims, 3 Drawing Sheets

(56) References Cited

U.S. PATENT DOCUMENTS

2009/0140739 A1    6/2009   Bennett
2011/0274183 A1   11/2011   Wang
2012/0161773 A1    6/2012   Evers et al.

FOREIGN PATENT DOCUMENTS

| CN | 1440593 A | 9/2003 |
| CN | 1543723 A | 11/2004 |
| CN | 101283286 A | 10/2008 |
| CN | 101454684 A | 6/2009 |
| CN | 101796743 A | 8/2010 |
| DE | 10 2010 064 096 A1 | 6/2012 |
| WO | WO 2008/155703 A1 | 12/2008 |
| WO | WO 2009/081378 A1 | 7/2009 |

OTHER PUBLICATIONS

Xiaolong et al., "Nuclear magnetic resonance micro-imaging system," Chinese Journal of Magnetic Resonance, vol. 17, No. 6, pp. 433-439, 2000.

Sanchez Lopez et al., "The Equivalent Magnetizing Method Applied to the Design of gradient Coils for MRI," Engineering in Medicine and Biology Society International IEEE EMBS Conference, pp. 2805-2808, 2008.

Zhang et al., "Quality indexes and optimization of MRI," Chinese Medical Device, vol. 23, No. 1, pp. 46-49, 2008.

Chinese Office Action dated Jun. 5, 2014 for corresponding Chinese Patent Application No. 201210092917.X with English translation.

* cited by examiner

LOCAL COIL SYSTEM

This application claims the benefit of DE 10 2011 006 497.4, filed on Mar. 31, 2011.

BACKGROUND

The present embodiments relate to a wireless transmission from a local coil system to a magnetic resonance system.

A magnetic resonance system includes a tomograph, in which a patient is positioned on a couch in a cylindrical measuring space. A strong magnetic field is provided in the tomograph. The strong magnetic field, on account of the activation of a gradient coil, includes a gradient. The nuclear spin of atoms is adjusted through the magnetic field. A transmitting antenna arrangement (e.g., a whole body transmitting antenna arrangement such as a birdcage antenna) is disposed within the tomograph in order to output magnetic resonance high frequency pulses so as to excite the atoms.

During a magnetic resonance examination, local coils may be used to receive the magnetic resonance response signals in order to receive the pulses during relaxation of the nuclear spin. Different materials exhibit different relaxation behavior, so that conclusions may be drawn as to the interior of the body of the patient on account of the relaxation behavior. The local coils may be combined in assemblies and include receiving antenna elements (e.g., in the form of conductor loops in each case). The received MR response signals may be preamplified in the local coil and routed out of the central region of the magnetic resonance system by way of cables and fed to a screened receiver of an MR signal processing device. The received data is digitalized and further processed. With many examinations, a plurality of such local coils is arranged on the patient in order to cover whole areas of the body of the patient.

The mode of operation of magnetic resonance systems is described, for example, in Imaging Systems for Medical Diagnostics, Amulf Oppelt, Publicis Corporate Publishing, ISBN 3-89578-226-2.

The local coils may be arranged in a local coil mat that is placed above or below the patient body. In addition, specially molded local coil systems such as head coils or neck coils, exist. The signals may be routed from the local coils to an evaluation device of the magnetic resonance system by cables. The cables are undesirable, since the cables may not be easily routed from the patient couch to the evaluation device and are perceived as bothersome by personnel. The patient couch is moved with the patient and the local coil mat, and the cables are consequently loosely routed.

Approaches for the wireless digital transmission of signals between the local coils and the magnetic resonance system are known. The field strength of the transmitter of the local coil is conventionally low, since the local coils may only be supplied with energy in a wireless fashion. In addition, the wireless transmission of signals must not interfere with the imaging. Individual transmitters of a local coil may be shielded on account of position, and the signal transmitted thereby fails to reach a receiver in the magnetic resonance system.

The local coils may be arranged extensively on the patient, and in many cases, the signals of many local coils are to be transmitted from the local coils to the magnetic resonance system at the same time. If a transmitter of a local coil is shielded (e.g., by a medical device or body parts), the image quality is reduced (e.g., the spatial resolution and/or the signal dynamics). The shielding of individual transmitters in the case of a large number of transmitters on a local coil mat with many local coils may be unavoidable and unpredictable. The precise positioning of the limbs of the patient may be no more reliably influenced than that of the medical device.

SUMMARY AND DESCRIPTION

The present embodiments may obviate one or more of the drawbacks or limitations in the related art. For example, a local coil system that enables a more secure, wireless transmission between the local coil system and the magnetic resonance system is provided.

One embodiment of a local coil system for a magnetic resonance system includes at least one local coil for detecting MR response signals and at least one transmitting device for wirelessly transmitting signals to a receiver of the magnetic resonance system. The local coil system is configured with a diversity on the transmitter side.

A transmitter-side diversity may be a redundant design of the transmission channels between the local coil and the receiver of the magnetic resonance system. Different realization possibilities for providing the transmitter-side diversity are explained in more detail below. A transmission channel may be a transmission path from a local coil via a transmitting device and a transmitting antenna to a receiver of the magnetic resonance system (e.g., a specific transmission channel includes, in each case, a specific combination including the local coil, transmitting device/devices and antenna(e)).

If a transmission channel and/or transmission path is interrupted or shielded by a transmitting device or transmitting antenna of the local coil system, another transmission path or transmission channel may be selected by another transmitting device or another antenna in order to transmit the MR response signals from the local coil to the magnetic resonance system.

One embodiment of a magnetic resonance system includes a local coil system and a receiver that is configured to receive the signals received from the transmitting facility.

In one embodiment of a method for transmitting signals that represent MR response signals, from a transmitting facility of a local coil of a magnetic resonance system to a receiver of the magnetic resonance system, the transmission of the signals with a transmitter-side diversity takes place accordingly. As a result, a signal to be transmitted may, for example, ensue at least if the transmission via a first transmission channel is unsuccessful via at least one second transmission channel. As a precaution, a parallel transmission may take place by way of several channels or only when no qualitatively adequate transmission may be determined on the transmitter side. In addition or alternatively, the quality of the transmission channels may also be observed, and a suitable transmission channel may be selected in each case as a function thereof.

The local coil system may include a plurality of antennae that are coupled to a transmitting device. The plurality of antenna may be connected to an output of the transmitting device by way of a first switching device. The plurality of antennae may be arranged on different locations in the local coil system (e.g., on the local coil mat). If the transmission path from an antenna to the receiver is shielded in the magnetic resonance system, another antenna may be used for transmission.

The local coil system may also include a local coil control device and a local coil receiving device. The local coil receiving device is configured to receive an item of information that indicates a first measure of the quality of a signal that is received by the receiver of the magnetic resonance system and is transmitted by one of the transmitting antennae of the local coil system. The local coil control device may instruct the first switching device to connect at least one antenna to the output of the transmitting device as a function of the first item of information. The first measure may be the antenna that is to transmit the signal to the receiver of the magnetic resonance system. The measure may, however, also transmit a plurality of quality values that correspond to the signal quality of the signals transmitted by the different antennae. In this case, the local coil system may select, using the control device, the antenna, from which the signal is transmitted. The signal may also be transmitted at the same time by a plurality of antenna. The expression "an" antenna does not exclude a plurality of antennae being connected to the output of the transmitting device at the same time. With this embodiment, the diversity is formed by a plurality of antennae, where at least one of the antennae may be electrically connected to the output of a transmitting device by the first switching device.

A plurality of transmitting devices may be connected to the local coil by way of a second switching device. The local coil receiving device may be embodied to receive a second item of information that indicates a second measure of the quality of a signal that is received by a receiver of the magnetic resonance system and is transmitted by one of the plurality of transmitting devices and by at least one antenna of the local coil system. The local coil control device may instruct the second switching device to electrically connect a plurality of transmitting devices to the local coil as a function of the second item of information. The second item of information and/or the second measure may indicate the transmitting device that is to be used to transmit the signal. The second item of information and/or the second measure may include signal quality information for a plurality of signals that is transmitted by the plurality of transmitting facilities. The second item of information and/or the second measure may include an item of information relating to a single signal that is transmitted from a single transmitting antenna and from a signal transmitting device. In this case, different combinations of transmitting device and antenna may be successively activated in order to find the transmitting device and antenna that provide the best signal quality.

The local coil system may include a third switching device that is connected to a local coil and a plurality of transmitting devices. The third switching device may be connected to a plurality of local coils and a plurality of transmitting devices. The third switching device may be configured to connect a plurality of local coils with a plurality of transmitting devices. With this embodiment, a number of local coils of the local coil system may be assigned to a number of transmitting devices and electrically connected thereto. The number of transmitting devices may be assigned to a number of transmitting antennae and be electrically connected thereto. The local coils that are used to detect the image may consequently be selected at random. The transmitting devices and transmitting antennae that provide that the signals of the selected local coils are received with adequate quality at the receiver of the magnetic resonance system may be used arbitrarily.

The local coil receiving device may be configured to receive a third item of information that indicates a third measure of the quality of a signal that is received by a receiver of the magnetic resonance system and is transmitted by one of the transmitting devices. The local coil control device may instruct the third switching device to connect at least one of the transmitting devices to the local coil as a function of the third item of information. The information and/or the measure may include an instruction, as to which local coil is to be coupled to which transmitting facility. The third item of information and/or the third measure may also indicate the quality, with which the signals transmitted by the respective transmitting device are received by the receiver of the magnetic resonance system. The local coil control device may determine a suitable assignment of local coils and signal devices.

The local coil receiving device may be configured to receive a fourth item of information that instructs the control device not to transmit the MR response signal of at least one local coil to the receiver of the magnetic resonance system. If, on account of the shielding of antennae, fewer antennae and/or transmitting devices are available, the number of local coils may be reduced in order to transmit the signal of all local coils, the MR response signals of which are transmitted. This provides non-relevant local coils to be excluded from the signal transmission for the actual measurement data transmission in order to transmit the MR response signals of the local coils, the MR response signals of which have the highest information content for the imaging.

The magnetic resonance system may also include a receiver-side diversity. A receiver-side switching device that is connected to a plurality of antennae and a demodulator and is configured to connect at least one antenna to the demodulator may be provided.

The one or more switching matrices and/or switching devices for the adaptive connection of digitalized local coils signals to transmitting devices may compensate for the failure or switching-off of individual transmitting devices. All or a partial quantity of all local coil signals of the local coil system are routed by way of at least one switching matrix and/or switching device that is connected to all or a partial quantity of all transmitting devices. The number and positioning of the local coils and transmitting devices of a switching matrix determines a local coil group that is provided with a redundancy for the data transmission via a local group of transmitting devices. The number of switching devices and/or switching matrices determines the number of the local groups. To be able to provide the redundancy, the data transmission capacity of all transmitting devices exceeds the total of the data rates of all local coil signals on this switching matrix per group in order to at least exceed the data rate of a local coil signal.

If the receiver of the magnetic resonance system determines that the signals of individual transmitting devices cannot be received, this is reported to the affected switching matrices of the local coil system by way of a feedback channel. The affected switching matrices select other transmitting devices in the local group for the transmission of the shielded signals and/or transmitting devices. This process may be repeated until either all redundancy transmitting devices have been successfully activated or until a combination of transmitting, for which all data flows may be successfully received by the receiver devices, is determined. If no such combination is determined, the transmission of all local coil signals of the group is not possible despite redundancy.

Local coil signals of this group from the transmission, which are not of interest or are less important to the imaging, may be completely excluded. This instruction may be handled by the operating personnel and/or the imaging software of the magnetic resonance system. This decision may not be taken by the local coil system. As a result, the redundancy of the transmitting devices in the relevant group may be further increased, and the probability that a successful combination may be determined with a combination of transmitting devices is thus also increased.

The quantity of data provided for the afore-cited feedback channel is comparatively low, since a relatively simple item of control information is transmitted. This data may be transmitted from the magnetic resonance system to the local coil system by way of an already existing communication channel (e.g., a communication channel), by way of which local coils may be activated or deactivated. This control information may also be inductively transmitted between the magnetic resonance system and the local coil.

In another embodiment, a predetermined number of transmitting devices may be assigned to a local coil and connected thereto. The antennae for emitting the radio signals are connected to this radio transmitter by way of a switching matrix and/or a switching device. As a result, the complexity of the switching arrangement of the local coil system may be reduced, and the signals are emitted by the antennae that have a good connection (e.g., a visual connection) with at least one receiver in the magnetic resonance system.

In one embodiment, the signal of a local coil may be forwarded to several antennae by way of a transmitting device in order to generate a spatial diversity of the radio signal. The signals from the local coil mat may therefore also be reliably transmitted to the receiver of the magnetic resonance signal if a significant shielding is present.

DETAILED DESCRIPTION OF THE DRAWINGS

Figure 1:
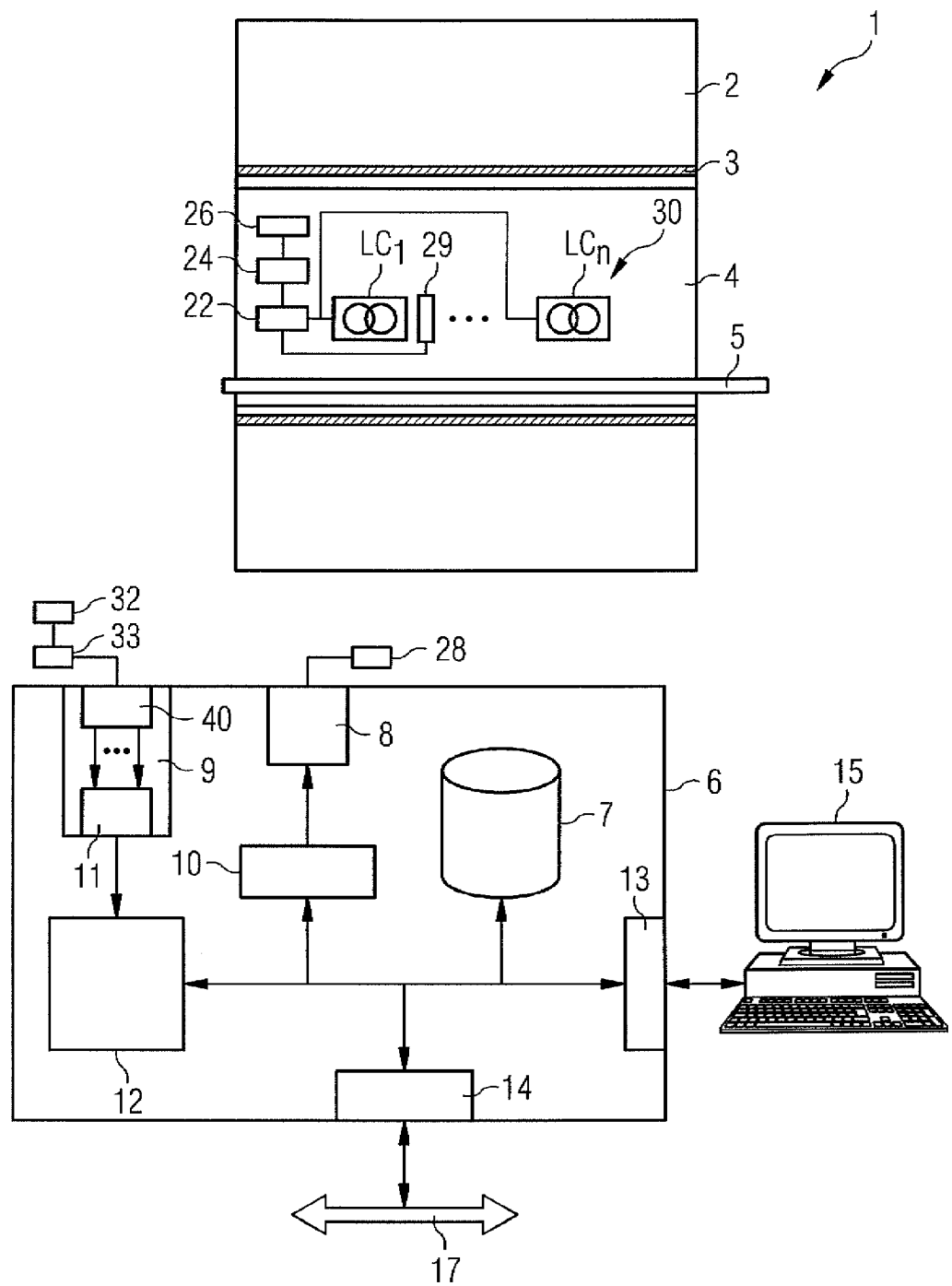
FIG. 1 shows a schematic representation of one embodiment of a magnetic resonance system.

FIG. 1 shows a simple basic block diagram of a magnetic resonance system 1. The magnetic resonance system 1 includes a conventional tomograph 2 (e.g., a scanner), in which a patient (not shown) is positioned on a couch 5 in a cylindrical measuring space 4. A whole body transmitting antenna arrangement 3 (e.g., a birdcage antenna) is located within the tomograph 2 in order to emit the magnetic resonance high frequency pulses.

In the exemplary embodiment according to FIG. 1, an MR receiving system 20 includes a local coil arrangement 30 (e.g., in the form of a local coil mat) with a number of local coils $LC_1, \ldots, LC_n$, and a transmission signal receiving module 40. The local coil arrangement 30 is arranged, as shown in FIG. 1, in a measuring space 4 of the tomograph 2 and/or a scanner of the magnetic resonance system 1, against which the transmission signal receiving module 40 is localized in an associated control device 6 of the magnetic resonance system.

An MR signal processing device 11 is part of the control device 6. The system is scalable at will (e.g., any number of physical inputs of the MR signal processing device 11 may be operated with a corresponding embodiment of the MR receiving system 20). For reasons of improved clarity, only one physical input is shown in the Figures.

The tomograph 2 is activated by the control device 6. A terminal 15 (and/or operator console) is connected to the control device 6 via a terminal interface 13, by way of which an operator may operate the control device 6 and thus the tomograph 2. The control device 6 is connected to the tomograph 2 by way of a tomograph control interface 8 and an image acquisition interface 9. Suitable control commands are output to the tomograph 2 by way of the tomograph control interface 8 via a sequence control unit 10 based on scan protocols, so that the desired pulse sequences (e.g., the high frequency pulse) and the gradient pulse are emitted for the gradient coils (not shown) in order to generate the desired magnetic fields. Raw data is acquired by way of the image data acquisition interface 9 (e.g., the received MR response signals are read out). The control device 6 also includes a mass storage device 7, in which generated image data may be stored, for example, and measuring protocols may be saved.

A further interface 14 is used for connection to a communication network 17 that is connected, for example, to an image communication system (Picture Archiving and Communication System (PACS)) or offers connection possibilities for external data storage.

Both the control device 6 and the terminal 15 may also be parts of the tomograph 2. The magnetic resonance system 1 also includes further conventional components and/or features that are not shown in FIG. 1 for the sake of improved clarity.

A local coil arrangement 30 with a number of local coils $LC_1, \ldots, LC_n$ is located in the scanner 2 to receive the magnetic resonance signals. The local coils are connected to the transmission signal receiving module 40 of the image acquisition interface 9 by way of the wireless interface. The received signals are further processed in the MR signal processing device 11 and fed to an image reconstruction unit 12. The image reconstruction unit 12 generates the desired magnetic resonance images from the processed signals in a conventional fashion. These may be stored, for example, in a memory 7, at least partially output on the operator terminal 15, or conveyed to other components such as the diagnosis station or mass storage device via the network 17.

An energy/instruction transmitting device 28 is connected to the tomograph control interface 8. The energy/instruction transmitting device 28 wirelessly transmits energy and instructions to the local coils $LC_1, \ldots, LC_n$. The local coil arrangement $LC_1 \ldots LC_n$ includes an energy/instruction receiving facility 29 that receives the wirelessly transmitted energy and the wirelessly transmitted instructions. The energy and instructions are routed to a local coil control device 22. The local coil control device 22 supplies the local coils $LC_1, \ldots, LC_n$ with energy and activates the local coils $LC_1, \ldots, LC_n$. MR signals received by the local coils are transferred to a local coil transmitting device 24 from the local coil control device 26 in prepared form (e.g., in digitalized form), where the MR signals are transmitted via a local coil transmitting antenna system 26 to a receiving antenna 32 of the magnetic resonance system 1. The signals received by the receiving antenna 32 are evaluated by a receiver 33 and fed to the transmission signal receiving module 40.

The MR response signals of the local coils $LC_1, \ldots, LC_n$ may be amplified, may be converted into a digital signal and may also be further processed in a different way for transmission to a receiver of the magnetic resonance system.

Figure 2:
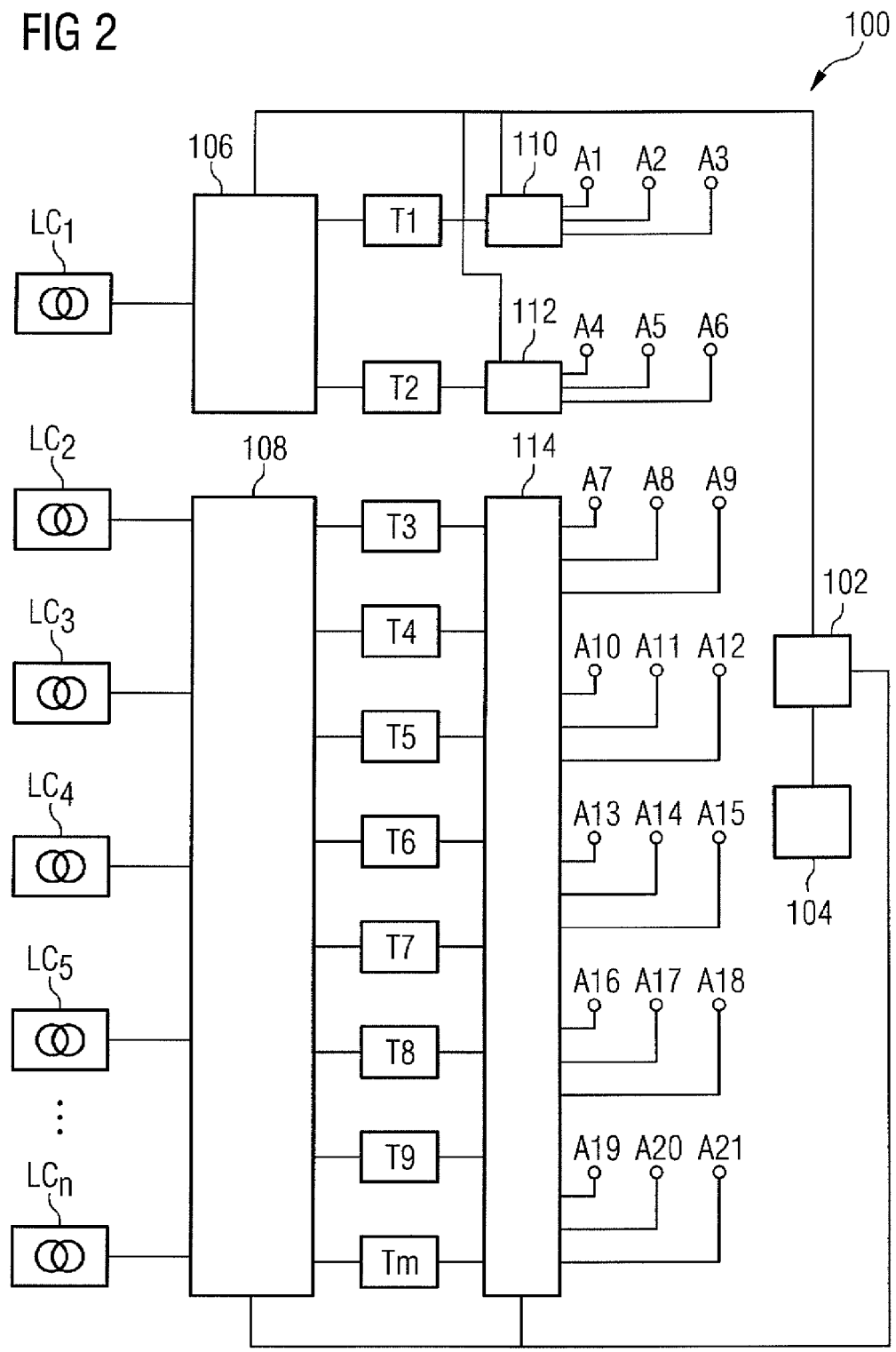
FIG. 2 shows a block diagram of one embodiment of a circuit arrangement for a local coil system.

In order to explain the local coil transmitting device system and the local coil transmitting antenna device that are shown in FIG. 1 only as functional blocks for the purpose of clarity, reference is made to FIG. 2. FIG. 2 shows a local coil system 100 having a plurality of local coils $LC_1, \ldots, LC_n$. A first local coil $LC_1$ is connected to a first switching device and/or switching matrix 106 (switching facilities may be referred to below as switching matrices). The first switching matrix 106 is also connected to a first transmitting device T1 and to a second transmitting device T2. A third switching matrix 110 is connected to the first transmitting device T1, to which three antennae A1, A2, A3 are connected. The second transmitting device T2 is connected to the antennae A4, A5, A6 by way of a fourth switching matrix 112.

The MR response signal of the first local coil $LC_1$ may be transmitted by the first transmitting device T1 and/or by the second transmitting device T2. The first switching matrix 106 may forward the signal of the first local coil $LC_1$ to the first transmitting device T1 and/or to the second transmitting device T2. The third switching matrix 110 may forward the output signal of the first transmitting device T1 to the first antenna A1, to the second antenna A2 and/or to the third antenna A3. The fourth switching matrix 112 may connect the fourth antenna A4, the fifth antenna A5 and/or the sixth antenna A6 to the second transmitting device T2.

A transmitter-side diversity may herewith be achieved, since the MR response signal of the first local coil $LC_1$ is transmitted via a plurality of transmitting devices T1, T2 and a plurality of antennae A1, . . . , A6. For example, the first transmitting device T1 and the first antenna A1, the second antenna A2 and third antenna A3 may be located in a head region of a local coil mat. The second transmitting device T2 and the fourth antenna A4, the fifth antenna A5 and the sixth antenna A6 may be found, for example, in a foot region of the local coil mat. It is possible to provide, independently of the position of the patient and thus of the local coil mat in the tomography, that one of the antennae A1, . . . , A6 may transmit the MR response signal of the local coil $LC_1$ to a receiver of the magnetic resonance system.

The first local coil $LC_1$, the first switching matrix 106, the first transmitting device T1, the second transmitting device T2, the third switching matrix 110, the fourth switching matrix 112 and the antennae A1 to A6 form a first local group. The first local group includes a first local coil $LC_1$ that detects MR response signals on a specific body part. The first local group may also include a plurality of local coils. The first transmitting device T1, the second transmitting device T2, and the antennae A1 to A6 are arranged at different spatial positions, distributed across the entire area of the local coil system and/or the local coil mat. The transmit signal of one of the antennae A1 to A6 may be sent to the receiver of the magnetic resonance system as independently as possible of the position of the patient in the tomograph.

The local coils $LC_2$, . . . , $LC_n$ are connected to a second switching matrix 108. A plurality of transmitting devices T3, . . . , Tm are connected to the second switching matrix 108. The second switching matrix 108 may therefore connect one or several transmitting facilities T3, . . . , Tm to one or several local coils $LC_2$, . . . , $LC_n$. More transmitting devices T3, . . . , Tm than local coils $LC_2$, . . . , $LC_n$ may be connected to the second switching matrix 108, as shown in FIG. 1.

A lower number of transmitting devices T3, . . . , Tm than local coils $LC_2$, . . . , $LC_n$ may also be provided. A transmitting device is to transmit the signals of several local coils. A redundancy is to be provided so that even with the shielding of one or more transmitting devices T3, . . . , Tm, the MR response signals of all local coils $LC_2$, . . . , $LC_n$ may be transmitted. Similarly, the number of transmitting devices T3, . . . , Tm and local coils $LC_2$, . . . , $LC_n$ may also be identical.

A fifth switching matrix 114 may be connected to the transmitting devices T3, . . . , Tm, the fifth switching matrix connecting the transmitting devices to a plurality of antennae A7, . . . , A21. The transmitting devices T3, . . . , Tm and the antennae A7, . . . , A21 may be located at any site on the local coil mat. The fifth switching matrix 114 may therefore connect one or several antennae A7, . . . , A21 to one or several transmitting devices T3, . . . , Tm.

The transmitting devices T3, . . . , Tm have a higher overall data transmission rate than is necessary in order to transmit the MR response signals of the local coils $LC_2$, . . . , $LC_n$. As a result, a redundancy is produced so that individual transmitting devices, the transmission channel and/or transmission path to the receiver of the magnetic resonance system of which is shielded, do not have to be used and may be switched off.

The local coils $LC_2$ to $LC_n$, the second switching matrix 108, the transmitting devices T3 to Tm, the fifth switching devices, and the antennae A7 to A21 form a second local group. The local coils $LC_2$ to $LC_n$ may be arranged on a body part, the MR response signals of which are to be received. The transmitting devices T3 to Tm and the antennae A7 to A21 may be redundantly positioned in a distributed fashion across approximately the entire area of the local coil mat and/or the local coil system. The imaging of the body part may thus be implemented independently of the position of the patient and the local coil mat in the tomograph and/or magnetic resonance system.

The first switching matrix 106, the second switching matrix 108, the third switching matrix 110, the fourth switching matrix 112, and the fifth switching matrix 114 are connected to the local coil control device 102. The local coil control device 102 is connected to a local coil receiving device 104. The local coil receiving device 104 may include an item of information from a transmitter of the magnetic resonance system. The item of information indicates a measure of the received signal or the received signals. The item of information may include an instruction that determines which transmitting device or devices are to transmit a transmit signal, via which antenna or antennae. The information may also indicate the quality of the signals received by the receiver of the magnetic resonance system. The information is transmitted from different transmitting devices and/or different antennae of the switching arrangement 100.

The local coil control device 102 may switch the first to fifth switching matrices 100, 108, 110, 112, 114 such that the MR response signals are transmitted via the transmitting device or devices, and the antenna or antennae have signals that are received by the receiver of the local coil system with a predetermined or higher quality.

The local coil control device 102 may also define successive combinations of one or more transmitting devices and/or one or more antennae that consecutively output a signal (e.g., if necessary, also a test signal that is received by the receiver of the magnetic resonance system). The magnetic resonance system transmits a signal to the local coil receiving device 104 by way of the transmitter of the magnetic resonance system, the signal indicating a measure of the quality of the received signal. If the quality of the signal received by the receiver of the magnetic resonance system is identical to or higher than a predetermined threshold value, the MR response signals of the respective local coil $LC_1$, . . . $LC_n$ may be transmitted by way of the combination of transmitting device T1, T2 and/or T3, . . . , Tm and antennae A1, . . . , A6 and/or A7, . . . , A21. This is determined in each case by the first switching matrix 106, the second switching matrix 108, the third switching matrix 110, the fourth switching matrix 112, and the fifth switching matrix 114.

Otherwise, the local coil control device 102 controls the first switching matrix 106, the second switching matrix 108, the third switching matrix 110, the fourth switching matrix 112, and/or the fifth switching matrix 114 so that another combination of transmitting device T1, T2 and/or T3, . . . , Tm and antenna(e) A1, . . . , A6 and/or A7, . . . , A12 is selected in order to transmit the MR response signal from the corresponding local coil $LC_1$, $LC_2$ and/or $LC_3$, . . . , $LC_n$. This process is repeated until the MR response signal is received from at least one transmitting device and at least one antenna with sufficient quality by the receiver of the magnetic resonance system, which is, for example, equal to or greater than a threshold value.

The control device 102 may instruct the second switching matrix 108 not to forward the signals of specific local coils that are not or only minimally relevant to the current imaging to a transmitting device. This is advantageous if a shielding provides that not all MR response signals may be transmitted by the transmitting devices and antennae of the switching arrangement 100 to the receiver of the magnetic resonance system on account of the bandwidth available for transmission purposes.

Figure 3:
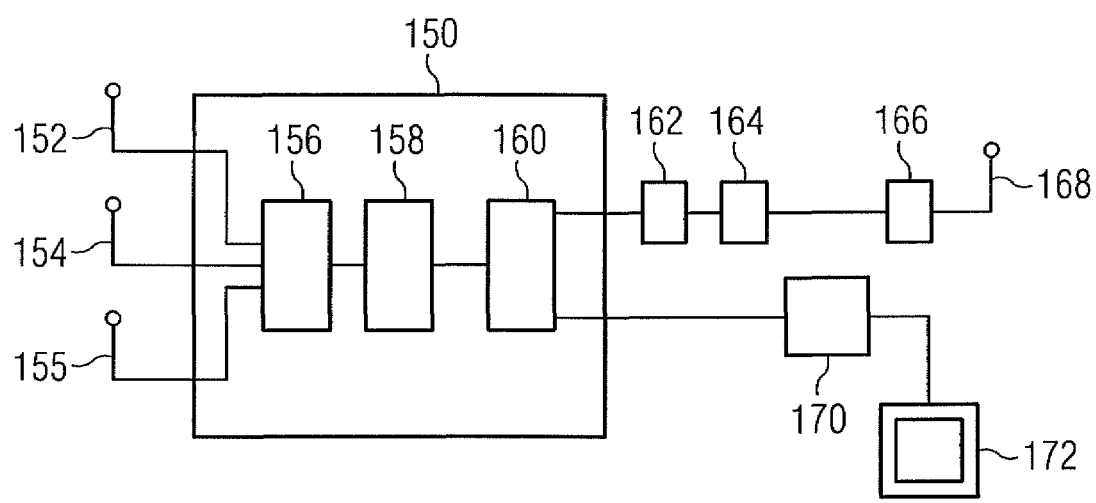
FIG. 3 shows one embodiment of a block diagram of a receiver of a magnetic resonance system.

In order to explain the components for receiving the diversity signal that is transmitted by the local coil system 100, reference is now made to FIG. 3. A plurality of antennae 152, 154, 155 is connected to a receiver 150. A receiver-side diversity may not be provided, and only one antenna 152 may be connected to the receiver 150. The receiver 150 includes a diversity module 156 that combines the multipath signals received on account of the receiver-side diversity into a single signal. A demodulator 158 of the receiver 150 demodulates the combined signal. An evaluation device 160 of the receiver 150 determines a quality measure of the received signal and/or the received signals. The evaluation device 160 generates a raw data flow that essentially corresponds to the MR response signals that are received by the local coils. This raw data flow is output to an image reconstruction device 170 that generates the image data. The image data may be displayed on a display device 172, for example, or may be used in any other way.

The quality measure is transferred to a quality measure evaluation device 162 that checks whether the quality of the received signal is equal to or greater than a predetermined threshold value. The result of the check is transferred to an instruction generation device 164 that generates an instruction as a function of the check to determine whether the current combination including the local coil, the transmitting device or device and the antenna or antennae generates signal that may be received at the receiver 150 with sufficient quality. This information forms a measure of the quality of the signal received at the receiver 150 and is modulated by a transmitter-side modulator 166 and transmitted to the local coil receiving device 104 by way of the transmitter-side antenna 168.

The image quality and the robustness of the digital data transmission are of importance. The present embodiments therefore offer a advantage in the surroundings with non-influenceable arrangements of local coils, the patient and medical devices, so that the effect of the shielding on the imaging may be reduced on account of the transmitter-side and/or receiver-side diversity.

The detailed method and structures are exemplary embodiments, and the basic principle may also be varied in further areas by a person skilled in the art without departing from the scope of the invention provided, as recited by the claims. The present embodiments may thus be used in a flexible fashion. When constructing a local coil system, the number of transmitting devices, the data transmission rate per transmitting device and the number of local groups that corresponds to the number of switching matrixes, may be varied in a flexible fashion. Two local groups are shown in FIG. 2. The local coil $LC_1$, the first switching matrix 106, the first transmitting device T1, the second transmitting device T2, the third switching matrix 110, the fourth switching matrix 112 and the antennae A1 to A6 form a first local group. The local coils $LC_2$ to $LC_n$, the second switching matrix, the transmitting devices T3 to Tm, the fifth switching matrix 114 and the antennae A7 to A21 form a second local group. The number of local coils, the number of radio transmitters, the redundancy resulting therefrom, and the positioning of the transmitting devices and the antennae may be varied per local group.

A local coil mat with the local coil system of the present embodiments may be created with a typical application area (e.g., the upper body) that, for example, is optimized for the most frequent of shielding scenarios, in this application, by each local group of a local coil mat being designed with the necessary redundancy.

The indefinite article "one" does not exclude the possibility of the relevant features also being present in multiples. The term "unit" may include several components that may, for example, also be distributed spatially.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A local coil system for a magnetic resonance (MR) system, the local coil comprising:
    at least one local coil for detecting MR response signals;
    at least one transmitter for wireless transmission of signals to a receiver of the MR system;
    a first switching device; and
    a plurality of antennae connected to an output of the at least one transmitter by way of the first switching device,
    wherein the local coil system is configured with a transmitter-side diversity, the transmitter-side diversity comprising the first switching device being configured to connect with at least one antenna of the plurality of antennae to transmit the signals to the receiver of the MR system.

2. The local coil system as claimed in claim 1, further comprising:
    a local coil controller; and
    a local coil receiver,
    wherein the local coil receiver is operable to receive a first item of information that indicates a first measure of a quality of a signal that is received by the receiver of the MR system and is transmitted by one antenna of the plurality of antennae of the local coil system, and
    wherein the local coil controller is operable to instruct the first switching device to connect the at least one antenna of the plurality of antennae to the output of the transmitter as a function of the first item of information.

3. The local coil system as claimed in claim 2, wherein the at least one transmitter comprises a plurality of transmitters that are connected to the at least one local coil by way of a second switching device.

4. The local coil system as claimed in claim 3, wherein the local coil receiver is configured to receive a second item of information that indicates a second measure of the quality of the signal that is received by the receiver of the MR system and is transmitted by one transmitter of the plurality of transmitters and by at least one antenna of the plurality of antennae of the local coil system, and
    wherein the local coil controller is operable to instruct the second switching device to connect one transmitter of the plurality of transmitters to the local coil as a function of the second item of information.

5. The local coil system as claimed in claims 3, further comprising a third switching device that is connected to the at least one local coil and to the plurality of transmitters.

6. The local coil system as claimed in claim 4, wherein the local coil receiver is operable to receive a fourth item of information that instructs the local coil controller to switch the first switching device, the second switching device, the third switching device, or a combination thereof so as not to transmit the MR response signals of the at least one local coil to the receiver of the magnetic resonance system.

7. The local coil system as claimed in claims 4, further comprising a third switching device that is connected to the at least one local coil and to the plurality of transmitters.

8. The local coil system as claimed in claim 7, wherein the local coil receiver is operable to receive a fourth item of information that instructs the local coil controller to switch the first switching device, the second switching device, the third switching device, or a combination thereof so as not to transmit the MR response signals of the at least one local coil to the receiver of the magnetic resonance system.

9. The local coil system as claimed in claim 7, wherein the at least one local coil comprises a plurality of local coils,
wherein the third switching device is connected to the plurality of local coils and to the plurality of transmitters, and
wherein the third switching device is configured to connect one local coil of the plurality of local coils to one transmitter of the plurality of transmitters.

10. The local coil system as claimed in claim 9, wherein the local coil receiver is operable to receive a fourth item of information that instructs the local coil controller to switch the first switching device, the second switching device, the third switching device, or a combination thereof so as not to transmit the MR response signals of the at least one local coil to the receiver of the magnetic resonance system.

11. The local coil system as claimed in claim 9, wherein the local coil receiver is operable to receive a third item of information that indicates a third measure of the quality of the signal that is received by the receiver of the magnetic resonance system and is transmitted by one transmitter of the plurality of transmitters, and
wherein the local coil controller is operable instruct the third switching device to connect at least one transmitter of the plurality of transmitters to one local coil of the plurality of local coils as a function of the third item of information.

12. The local coil system as claimed in claim 11, wherein the local coil receiver is operable to receive a fourth item of information that instructs the local coil controller to switch the first switching device, the second switching device, the third switching device, or a combination thereof so as not to transmit the MR response signals of the at least one local coil to the receiver of the magnetic resonance system.

13. The local coil system as claimed in claim 1, wherein the at least one transmitter comprises a plurality of transmitters that are connected to the at least one local coil by way of a second switching device.

14. A magnetic resonance (MR) system comprising:
a local coil system comprising:
at least one local coil for detecting MR response signals;
at least one transmitting device for wireless transmission of signals to at least one receiver;
a demodulator;
a plurality of antennae;
a transmitter-side switching device configured to connect at least one antenna of the plurality of antennae to the demodulator,
wherein the local coil system is configured with a transmitter-side diversity, the transmitter-side diversity comprising the transmitter-side switching device being configured to connect with at least one antenna of the plurality of antennae to transmit the signals to the receiver of the MR system; and
the at least one receiver configured to receive the signals transmitted by the local coil system.

15. A method comprising:
detecting magnetic resonance (MR) response signals with at least one local coil of a magnetic resonance system;
wirelessly transmitting signals representing MR response signals to a receiver of the magnetic resonance system from a transmitter of the at least one local coil of the magnetic resonance via at least one antenna of a plurality of antennae connected to an output of the transmitter by way of a switching device,
wherein the transmission of the signals takes place with transmitter-side diversity, the transmitter-side diversity comprising connecting the switching device with the at least one antenna of the plurality of antennae to transmit the signals to the receiver of the magnetic resonance system.

* * * * *